United States Patent [19]

Bernstein

[11] 4,118,666

[45] Oct. 3, 1978

[54] AUTOMATIC COMMUNICATION SIGNAL MONITORING SYSTEM

[75] Inventor: Albert J. Bernstein, Covina, Calif.

[73] Assignee: The United States of America as represented by the Administrator of the National Aeronautics and Space Administration, Washington, D.C.

[21] Appl. No.: 774,384

[22] Filed: Mar. 4, 1977

[51] Int. Cl.² .......................................... G01R 23/16
[52] U.S. Cl. ................................ 324/77 C; 324/77 B; 307/233 R
[58] Field of Search ................ 324/77 R, 77 B, 77 C, 324/77 CS, 78 R; 307/233 R

[56] References Cited

U.S. PATENT DOCUMENTS

| 3,891,920 | 6/1975 | Wiliams | 324/77 B |
| 4,041,387 | 8/1977 | Dalichow | 324/77 C |

*Primary Examiner*—M. Tokar
*Attorney, Agent, or Firm*—Monte F. Mott; John R. Manning; Wilfred Grifka

[57] ABSTRACT

A system for automatic monitoring of a communication signal in the RF or IF spectrum utilizes a superheterodyne receiver technique with a VCO to select and sweep the frequency band of interest. A first memory is used to store one band sweep as a reference for continual comparison with subsequent band sweeps. Any deviation of a subsequent band sweep by more than a predetermined tolerance level produces an alarm signal which causes the band sweep data temporarily stored in one of two buffer memories to be transferred to long-term store while the other buffer memory is switched to its store mode to assume the task of temporarily storing subsequent band sweeps. Each alarm signal alternates the roles of the two buffer memories. In a second embodiment, the roles of the two buffer memories are switched at the end of each heterodyne receiver band sweep for display of successive band sweeps at a faster rate and for automatic long-term store of any band sweep producing an alarm.

9 Claims, 5 Drawing Figures

AUTOMATIC COMMUNICATION SIGNAL MONITORING SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to a system for continuously monitoring and analyzing the power level and spectral quality of an RF or IF communication signal.

In communication systems, there is a problem of assuring the power level and spectral quality of the RF signal transmitted, or the IF output of a receiver. This problem is particularly acute in aerospace communications, where verification of the power level and spectral quality of a transmitter RF output, or a receiver IF output, is necessary in analyzing the command communications links to the spacecraft, and it is generally important in commercial communications, such as in TV or FM broadcasting.

It frequently happens that a transmitter malfunction will occur under particular environmental conditions, or will occur only momentarily. In either case there may be a failure in transmitting the proper communication. In the case of transmitting a command to a spacecraft, it is important to know that this failure has occurred in order to retransmit the command and/or to take corrective measures. However, to be able to take corrective measures, it is sometimes necessary to analyze the signal output of the transmitter at the time of the failure. In some cases retransmission of the command is sufficient, but in other case it is important to know what happened, and when, for complete analysis and corrective action. In the past it has been possible to determine only that there has been some failure in communications when the spacecraft fails to respond properly. By then it is not possible to analyze the transmitter output to determine the cause, unless the failure is a continuing one. For proper analysis, it is necessary that the failure be detected when it occurs, and that the transmitter output at the moment of failure be preserved for analysis. It is also useful to continuously monitor and analyze the power level and spectral quality of a receiver to detect the presence of an interfering signal, for example.

SUMMARY OF THE INVENTION

In accordance with the present invention, a communication signal is monitored as to its power level and spectral quality throughout a selected frequency band by periodically sweeping the band and converting the peak amplitude of the band in a number of equally spaced increments to digital form for comparison with reference values stored in digital form. Any deviation in subsequent band sweep data from the reference values is checked to determine whether the deviation has exceeded a predetermined tolerance level. In the meantime, the amplitude of each data point in each sweep of the band is stored in a buffer memory. Once the tolerance level of any deviation detected has been exceeded during any sweep, an alarm signal is generated by suitable means to cause the last band sweep data stored in a buffer memory to be read out and stored in a long-term store. The modes of the two buffer memories are alternated so that one may store new band sweep data while the other is read out, either every time an alarm signal is received or after every band sweep. In the latter case, the buffer memory in the read mode may be read out a number of times for display, or display and transfer to long-term store, during the next band sweep. The content of a real-time clock is also transferred into the long-term store each time an alarm signal is generated for subsequent off-line analysis of the cause of the communication signal failure to satisfy the spectral tolerance levels. The two buffer memories are thus alternately placed in service as monitors so that, in the event of an alarm condition, the next band sweep data is stored in one of those two memories, and then transferred to a long-term store together with real-time data for subsequent analysis as to the nature and cause of the alarm condition.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
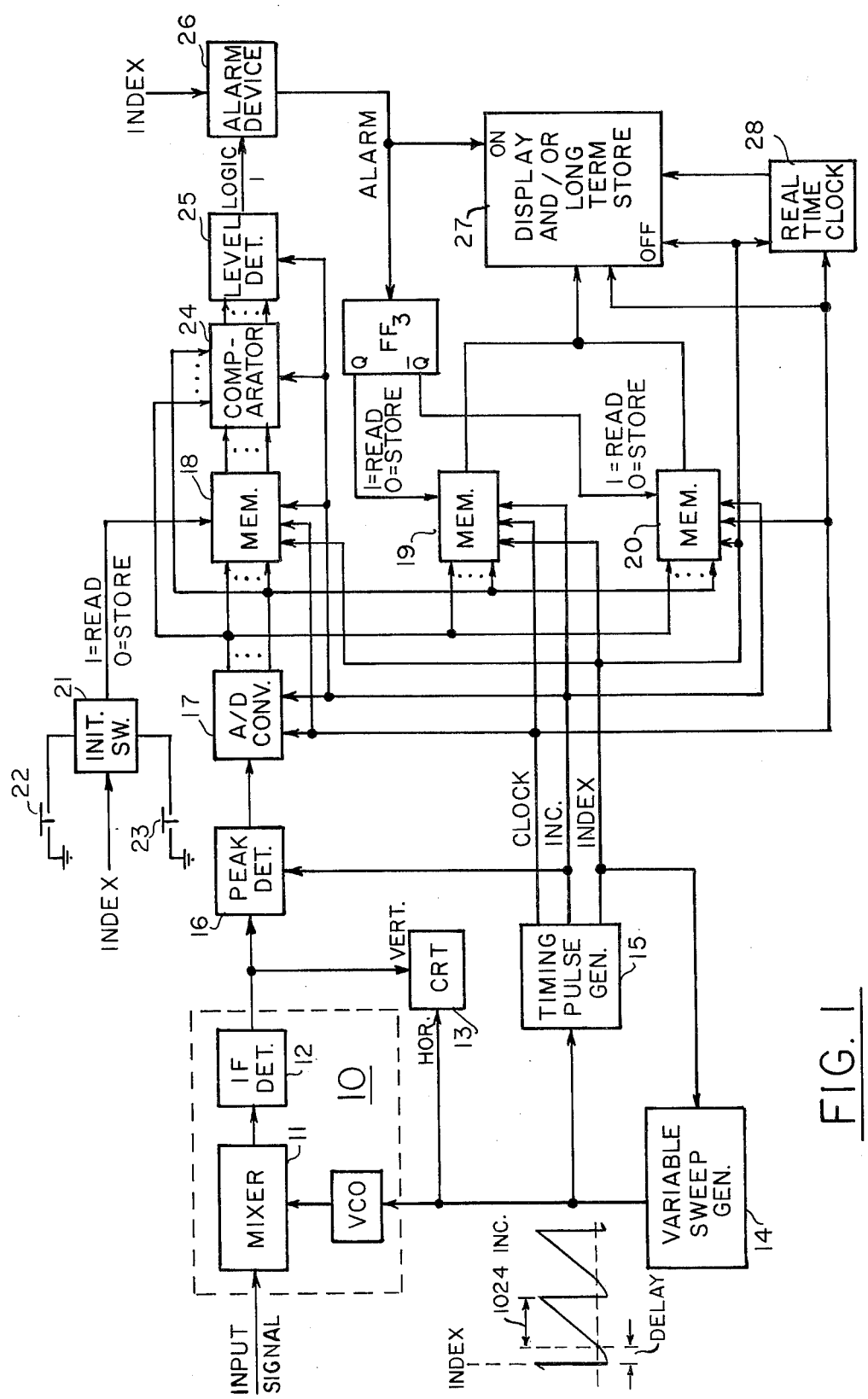
FIG. 1 is a block diagram of the system for automatic monitoring of an RF signal according to the present invention.

A system for automatic monitoring and analysis of the power level and spectral quality of an RF or IF communication signal is provided with means for sweeping a frequency band of interest in the signal for comparison with a reference band sweep, means for producing an alarm when the signal band sweep deviates from a reference band sweep by more than a predetermined tolerance level, and means for recording the signal band sweep data and real time whenever an alarm condition is present in order to permit subsequent analysis of the nature and cause of the alarm condition. The implementation of such an automatic system involves a swept frequency analyzer 10 having a voltage-controlled oscillator, VCO, to sweep the frequency band of interest. The VCO output is mixed with the communication signal in a broadband mixer 11 to obtain from an IF amplifier-detector 12 the beat frequencies corresponding to the spectrum of interest in the communications signal. The detected output drives the vertical deflection plates of a cathode-ray tube 13 while its horizontal deflection plates are driven by the saw-tooth output waveform of a variable sweep generator 14 to display the amplitude of the various frequency components that make up the RF signal.

Although there are other methods that could be used to display a complex signal in the frequency domain, this superheterodyne receiver technique is preferred for its simplicity and the facility with which it can be used to select the frequency band of interest by adjusting the nominal frequency of the VCO and the voltage range of the sweep generator. In practice, the sweep generator is also adjustable as to its repetition rate.

A Systron-Donner Spectrum Analyzer Model 4809 with a Model 4745 tracking preselector may be employed for this preferred superheterodyne receiver analyzer. It provides calibrated frequency spans from 10 KHz to 2 GHz (full CRT screen) and permits manual tuning with visual display of the detected RF signal. Resolution bandwidths from 1 MHz to 300 Hz are provided with logarithmic or linear display on the CRT with a frequency response flatness of ±5dB for the highest frequency range and ±1dB for the lowest frequency range.

The detected output of the IF amplifier is peak detected in a number of evenly spaced increments in the selected band sweep, such as 1024 increments, and the peak value detected at each increment of a frequency sweep is converted from analog-to-digital form for display and storage. To accomplish that, a timing pulse generator 15 receives the output of the sweep generator 14 and divides each ramp into the desired number of evenly spaced increment (INC) pulses. At the end of the ramp, an INDEX pulse is generated and the timing pulse generator is recycled for operation during the next ramp. Each INC pulse recycles a sample-and-hold peak detector 16 and recycles an analog-to-digital (A/D) converter 17. In that manner, the peak voltage detected during an INC pulse period is sampled and converted to digital form. As each new sample is entered into the converter, the value in digital form of the sample just converted is transferred into a memory for subsequent display of the entire band sweep. Actually three memories 18, 19 and 20 are provided to implement the present invention.

Figure 2:
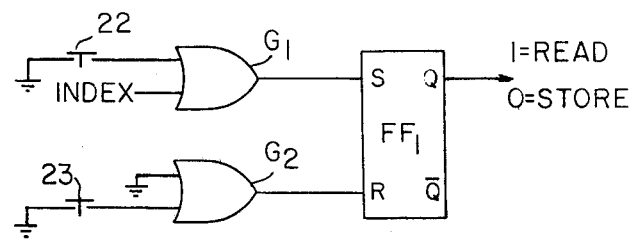
FIG. 2 is a logic diagram for an initializing control switch.

Each memory receives the parallel output of the A/D converter. However, the first memory is operated in a store mode by an initiate switch 21 only until the end of a band sweep selected by a push-button 22. Upon the occurrence of an INDEX pulse while the switch 22 is closed, the mode control input of the memory is switched from the logic 0 level (store) to a logic 1 level (read). The control unit remains in the read mode until manually reset by a switch 23. FIG. 2 illustrates an exemplary initiate switch implemented with a set-reset flip-flop $FF_1$ and two NOR-gates $G_1$ and $G_2$. In that manner the last band sweep displayed on the CRT after the switch 22 is momentarily depressed is stored in the first memory 18. One of the two memories 19 and 20 is initially in the read mode while the other is in the store mode. The mode change of the first memory by the control unit 21 will not affect the operation mode of the other two memories.

Figure 3:
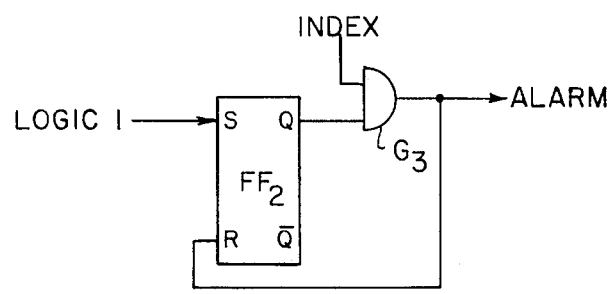
FIG. 3 is a logic diagram for an alarm device.

In practice, the first memory is caused to store a band sweep selected as the standard or reference for the RF signal from a transmitter. Once the reference sweep is thus captured in the first memory, it is read out continually for comparison with subsequent band sweeps by a comparator 24 which subtracts the reference value at each data point of the band sweep from the corresponding point of subsequent band sweeps, and transmits the difference to a level detector 25 to detect when the difference exceeds a preset value. When it does exceed the preset value, it produces a logic 1 level signal that triggers an alarm device 26 to cause the last sweep stored in one of the memories 19 and 20 to be transferred to a display and/or longterm store 27. FIG. 3 illustrates an exemplary alarm device comprising a flip-flop $FF_2$ and a gate $G_3$ for producing an ALARM pulse synchronized by an INDEX pulse at the end of the sweep. The unit 27 also receives other data for display and/or long-term storage in separate channels, as will be described presently. The level detector 25 may be preset to determine whether or not the difference is within a tolerance level of, for example, +10dB and −4dB, although it is preferred to preset the positive and negative levels equally, such as +6dB and −6dB, because then the level detector is required to just compare the absolute value out of the comparator with a single preset value by subtracting one from the other.

The alarm device 26 may receive an out-of-tolerance signal from the level detector at one or more points of band sweep data. The act of switching the flip-flop $FF_2$ to the set state produces a positive (logic 1) signal that enables the gate $G_3$ to transmit an INDEX pulse as the ALARM pulse to trigger a T-type flip-flop $FF_3$, thus transferring the store mode from the second memory 19 to the third memory 20, or vice versa, and switching the memory that was in the store mode to a read mode. At the same time, the long-term store is switched on for the purpose of storing the output of whichever memory is switched into the read mode. In that manner the alarm device simultaneously switches the long-term store on to store data and triggers the flip-flop $FF_3$ which in turn switches one of the memories 19 and 20 into the read mode to read out the band sweep values just stored in a buffer memory and to transfer the data thus read out into a long-term store in the unit 27.

At the end of the next band sweep, an INDEX pulse resynchronizes the memories 19 and 20, and for repeated display of the band sweep data just entered into the long-term store, resynchronizes the unit 27, but unless the alarm device is again triggered, the long-term store will not store another set of band sweep data. Once the alarm device is triggered again, the unit 27 will proceed to store another set of band sweep data, but the data will come from the alternate one of the buffer memories 19 and 20 in response to the triggering of the flip-flop $FF_3$. In that manner one or the other of the buffer memories 19 and 20 is continually storing band sweep data until an alarm condition occurs. At the end of that band sweep, the other buffer memory takes over the task of buffer storing band sweep data while the last set of band sweep data stored in a buffer memory is transferred to long-term store.

Each time a set of band sweep data is transferred to the long-term store, the digital output of a real time clock 28 is transferred to the long-term store in order to permit offline analysis of the data. The long-term store function may be implemented with a magnetic tape memory deck having at least two recording channels, one channel for the data recorded serially under control of INC pulses (for parallel read out into a shift register) and CLOCK pulses (for serial storage of the contents of the shift register), and one channel for the real time output of the clock 28. To store the time code serially in one recording channel, the time code is cyclically read out in parallel into an output shift register in response to INDEX pulses and shifted out to the long-term store serially in response to CLOCK pulses. To facilitate later reading and decoding the real time thus recorded, the CLOCK pulses are also recorded on a third channel. In that manner, once the long-term store 27 is turned on by an ALARM signal, a set of band sweep data in the memory then switched to the read mode is read out in response to INC pulses, and each value thus read out in parallel is recorded serially in response to higher frequency CLOCK pulses. Meantime the time code read out of the real time clock in parallel (in response to an INDEX pulse) is stored serially in response to CLOCK pulses. The next INDEX pulse turns off the long-term store.

It should be noted that although a magnetic tape recorder has been referred to for the long-term store, other forms of long-term storage may be provided such a photographic film. A scope camera attached to the display CRT may be actuated by the alarm signal to open its shutter. The band sweep data then displayed in analog form is recorded on the film. The next INDEX pulse may then close the shutter to complete the recording process. Once the shutter is closed, the film drive mechanism is activated to advance the recording film one frame.

It should be noted that the output of the variable sweep generator inherently has a finite delay between the time the ram voltage falls to generate an INDEX pulse and the time the new ramp voltage for the next sweep progresses into a linear region of sufficient amplitude to cross a lower threshold level that allows generation of INC pulses and higher frequency CLOCK pulses to begin. This finite delay is useful in allowing for the start-up time required by the long-term store, whether it be to start a magnetic tape drive mechanism or to open the shutter of a scope camera.

Figure 4:
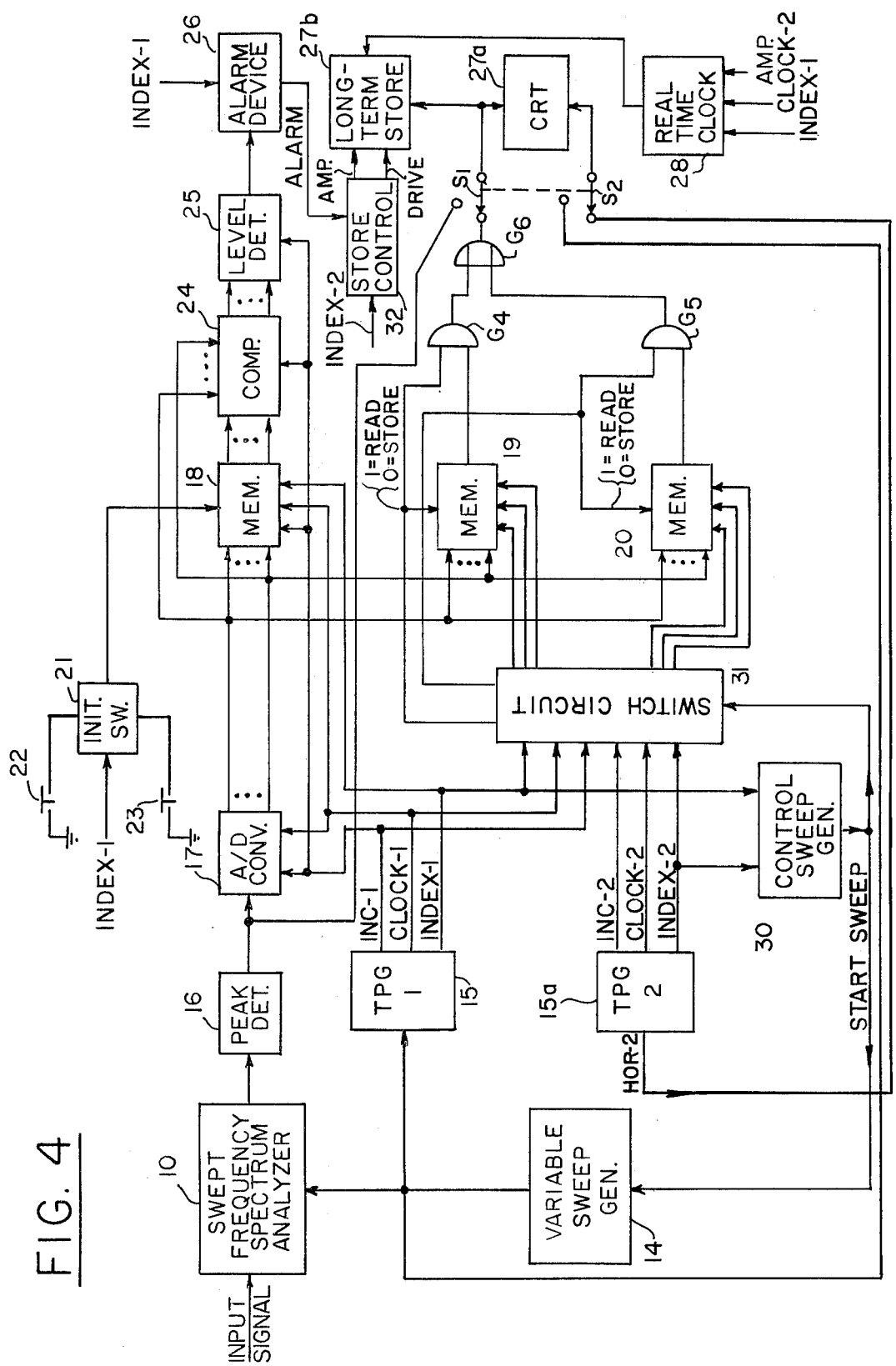
FIG. 4 is a block diagram of a second embodiment.

Referring now to FIG. 4, a variant of the present invention includes means for switching the roles of the second and third memories at the end of each sweep, and means for displaying the contents of the memory in the read mode at a flicker-free rate higher than the system sweep rate. In that way slowly gathered data is displayed continuously, and updated at the end of each sweep. When an alarm condition occurs, the content of the memory storing the band sweep data producing the alarm condition will be transferred to long-term store. To facilitate description of this variant, all of the components of the system common to the system of FIG. 1 are identified by the same reference numerals. Only the additional units will then need to be described.

A major difference is that a second timing pulse generator (TPG) is provided. That additional TPG is identified by the reference numeral 15a. It is very similar to the timing pulse generator 15 except that it is free-running and not synchronized by the output of the variable sweep generator 14. These timing pulse generators will hereafter be referred to as TPG 1 and TPG 2, and their outputs will be distinguished by the suffixes "−1" and "−2." TPG 2 includes a free-running ramp generator which can be adjusted to provide INDEX-2 pulses at a rate sufficiently high to provide flicker-free display of the content of the memory 19 or 20, whichever is in the read mode at the time while the system is set for normal operation with ganged switches S₁ and S₂ in the positions shown. The output of the variable sweep generator internal to TPG 2 is a ramp signal HOR-2 used for horizontal control of a CRT display unit 27a. The index pulses, INDEX-1 and INDEX-2 of the two timing pulse generators are applied to a control unit 30 which is simply a logic network that delays starting a new sweep in the generator 14 until any sweep in progress in TPG 2 has been completed. That is accomplished by storing INDEX-1 in a buffer flip-flop until the next INDEX-2 occurs. INDEX-2 is then gated out as a start sweep signal. A circuit identical to that shown in FIG. 3 will accomplish the task where INDEX-1 replaces LOGIC 1 and INDEX-2 replaces INDEX. In that manner TPG 2 is allowed to run free while TPG is synchronized with TPG 2.

The first memory 18 receives the timing signals INC-1, CLOCK-1 and INDEX-1 continuously while memories 19 and 20 alternately receive the signals INC-1, CLOCK-1, and INDEX-1 from TPG 1, and INC-2, CLOCK-2 and INDEX-2 from TPG 2, through a switching circuit 31. At the same time, mode control signals to the memories from the circuit 31 cause the memory receiving timing signals from TPG 2 to be in the read mode and the other in the store mode. The switching circuit 31 is thus comprised of a flip-flop having a function similar to the flip-flop $FF_3$ of FIG. 1, and two set of gates, one set to distribute the outputs of TPG 1 and TPG 2 to the respective memories 19 and 20 while the memory 19 is placed in the store mode and the memory 20 is placed in the read mode, and the other set to distribute the outputs of TPG 1 and TPG 2 to the respective memories 20 and 19 while the memory 19 is placed in the read mode and the memory 20 is placed in the store mode.

As noted with reference to FIG. 1, the mode control signals are at the logic level 1 for a read operation. The mode control signals for the memories 19 and 20 may therefore be used to enable respective AND gates $G_4$ and $G_5$ to transmit the output of one memory (via OR gate $G_6$) to the CRT display 27a at all times, first from one memory while the other is storing data from a new band sweep, and then the other while the first one is storing data.

Figure 5:
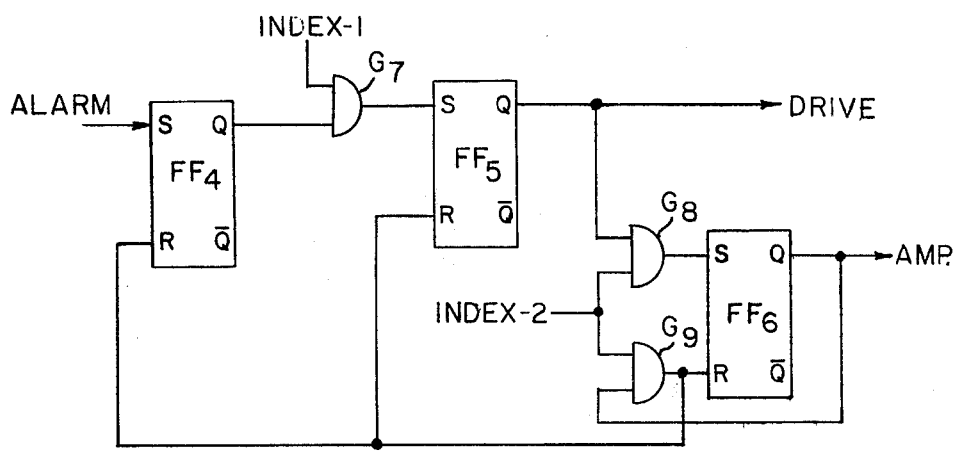
FIG. 5 is a logic diagram for a store control circuit in the second embodiment.

If an alarm condition is detected during any band sweep, the alarm device is triggered by the next INDEX-1 pulse from the system timing pulse generator TPG 1. That arms a store control circuit 32 to turn long-term store 27b on in response to the next INDEX-2 pulse in order for the content of the memory which has just stored a set of band sweep data to be transferred into the long-term store unit. Since the period of the read cycle controlled by TPG 2 is less than the sweep cycle controlled by TPG 1, the next INDEX-2 pulse is employed to turn off the long-term store. The INDEX-1 pulse from TPG 1 is used to gate a time code from the real time clock 28 to its output register. But since recording of data is now at a higher bit rate set by the INC-2 signal, which includes 1024 pulses for each cycle of the INDEX-2 signal, the CLOCK-2 pulses are applied to the real time clock to shift the contents of its output register serially into the long-term store while the ON signal is present from the store control circuit 32. FIG. 5 illustrates an exemplary control circuit comprised of three flip-flops $FF_4$, $FF_5$ and $FF_6$ and three AND gates $G_7$, $G_8$ and $G_9$. An alarm condition during a band sweep sets flip-flop $FF_4$. At the end of the band sweep, an INDEX-1 pulse is gated through gate $G_7$ to set flip-flop $FF_5$ to provide a recorder drive signal. Following that, an INDEX-2 pulse is gated through gate $G_8$ to set a flip-flop $FF_6$ on. The Q output of the flip-flop $FF_6$ gates the recorder amplifier on to permit recording the next set of band sweep data displayed on the CRT 27a. At the end of the display cycle, an INDEX-2 pulse is gated through an AND gate $G_9$ to reset the flip-flops $FF_4$, $FF_5$ and $FF_6$. It should be noted that the first two INDEX-2 pulses after the flip-flop $FF_5$ is set will occur during the delay period of the variable sweep generator 14 because TPG 2 is free running at a sufficiently high rate so that the band sweep data to be stored is recorded before there is any possibility of another alarm signal occuring during the next band sweep.

Ganged switches $S_1$ and $S_2$ are set in their alternate positions from those shown for initial selection and storage of a reference band sweep in the memory 18 using the CRT display 27a. Switch $S_1$ selects the input of the peak detector for initial display of band sweeps. Once the operator selects a band sweep for use as a reference through operation of the initial switch 21, the switches $S_1$ and $S_2$ may be restored to the position shown.

Although particular embodiments of the invention have been described and illustrated herein, it is recognized that modifications and equivalents may readily occur to those skilled in the art. For example, in the second embodiment, additional switch positions may be provided for the switches $S_1$ and $S_2$ to permit display of information from other points in the systems to aid in setting up the system and in checking the operation of the system. Consequently, it is intended that the claims be interpreted to cover such modifications and equivalents.

What is claimed is:

1. A system for monitoring an RF or IF communication signal as to its power level and spectral quality throughout a selected frequency band comprising
    means for periodically sweeping the spectrum of said selected frequency band,
    means for detecting the peak amplitude of evenly spaced increments of said spectrum,
    means for converting the peak amplitude of each increment of a sweep cycle into digital form to provide digital band sweep data,
    reference memory means for storing digital band sweep data of a selected sweep cycle for use as a reference,
    means for comparing digital band sweep data of subsequent sweep cycles with said reference to determine the presence of any deviation,
    level detecting means for determining when any deviation detected exceeds preset tolerance levels,
    temporary storage means for temporarily storing digital band sweep data of each of said subsequent sweep cycles while being processed through said comparing means and level detecting means, and
    long-term store means responsive to said level detecting means for storing band sweep data from said temporary storage means when any deviation of band sweep data of a subsequent sweep cycle exceeds said tolerance levels.

2. A system as defined in claim 1 including a second temporary storage means and means for alternately operating said temporary storage means for one storage means to store band sweep data while the other storage means in transferring band sweep data into said long-term store following a sweep cycle during which a deviation is found to exceed said tolerance levels.

3. A system as defined in claim 2 wherein said alternating means automatically switches operation of said two temporary storage means after every sweep cycle whether or not band sweep data is to be stored in said long-term store and means for automatically displaying band sweep data in one temporary storage means while the other is storing subsequent band sweep data.

4. A system for automatic monitoring of a communication signal in the RF or IF spectrum comprising
    superheterodyne receiver means for selecting and continually sweeping a frequency band of interest in said signal,
    means for determining the peak amplitudes of evenly spaced increments of a selected band sweep to obtain a set of band sweep data,
    reference memory means for storing one set of band sweep data as a reference for comparison with subsequent sets of band sweep data,
    two buffer memory means for alternately storing sets of band sweep data in one memory means while other buffer memory means is available for reading out sets of band sweep data,
    means for storing at least one set of said band sweep data for a long term,
    means for detecting any deviation of a subsequent band sweep from said reference by more than a predetermined tolerance level, and
    means responsive to said detecting means for causing a set of band sweep data stored in one of said buffer memory means to be transferred to said long-term storing means when it is found to contain a deviation of more than said predetermined tolerance level while a subsequent set of band sweep data is stored in the other of said buffer memory means.

5. A system as defined in claim 4 including means for alternating the roles of said two buffer memory means after each set of band sweep data found to contain a deviation of more than said predetermined tolerance level.

6. A system as defined in claim 4 including means for alternating the roles of said two buffer memory means after each set of band sweep data is stored in one of said two buffer memory means.

7. A system as defined in claim 6 including band sweep data display means, and means for continually displaying band sweep data from one of said two bufer memory means while the other is assigned the role of storing a set of band sweep data.

8. A system as defined in claim 7 wherein said continual display means is comprised of a cathode ray tube and including means for repeatedly reading out a set of band sweep from the buffer memory assigned the role of displaying data at a rate greater than said superheterodyne receiver means is being swept, whereby flicker-free display is provided.

9. A system as defined in claim 8 wherein said means responsive to said detecting means for causing a set of band sweep data stored in one of said buffer memory means to be transferred to said long-term storing means including means for transferring just once a set of band sweep data read out for display on said cathode ray tube.

* * * * *